US009679636B2

United States Patent
Katoch

(10) Patent No.: US 9,679,636 B2
(45) Date of Patent: Jun. 13, 2017

(54) MEMORY ARCHITECTURE

(71) Applicant: TAIWAN SEMICONDUCTOR MANUFACTURING COMPANY, LTD., Hsinchu (TW)

(72) Inventor: Atul Katoch, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/929,496

(22) Filed: Nov. 2, 2015

(65) Prior Publication Data

US 2016/0148660 A1    May 26, 2016

Related U.S. Application Data

(60) Provisional application No. 62/084,726, filed on Nov. 26, 2014.

(51) Int. Cl.
    *G11C 5/06*          (2006.01)
    *G11C 11/419*      (2006.01)
    *G11C 11/413*      (2006.01)
    *G11C 11/412*      (2006.01)

(52) U.S. Cl.
    CPC .......... *G11C 11/419* (2013.01); *G11C 11/412* (2013.01); *G11C 11/413* (2013.01)

(58) Field of Classification Search
    CPC .... G11C 11/412; G11C 11/413; G11C 11/419
    USPC .......................................................... 365/72
    See application file for complete search history.

(56) References Cited

U.S. PATENT DOCUMENTS

| | | | | |
|---|---|---|---|---|
| 6,563,730 B1 * | 5/2003 | Poplevine | ............. | G11C 11/419 365/154 |
| 6,819,579 B1 * | 11/2004 | Liu | ........................ | G11C 15/04 365/190 |
| 7,986,566 B2 * | 7/2011 | Houston | ............... | G11C 7/1051 365/189.05 |
| 8,605,523 B2 | 12/2013 | Tao et al. | | |
| 8,619,477 B2 * | 12/2013 | Wang | ..................... | G11C 11/413 365/154 |
| 8,630,132 B2 | 1/2014 | Cheng et al. | | |
| 8,760,948 B2 | 6/2014 | Tao et al. | | |
| 8,958,232 B2 * | 2/2015 | Chang | ..................... | G11C 7/067 365/154 |
| 8,976,574 B2 * | 3/2015 | Ahmed | ................... | G11C 29/50 365/154 |
| 2014/0032871 A1 | 1/2014 | Hsu et al. | | |
| 2014/0153321 A1 | 6/2014 | Liaw | | |
| 2014/0153345 A1 | 6/2014 | Kim et al. | | |
| 2014/0177352 A1 | 6/2014 | Lum | | |
| 2014/0233330 A1 | 8/2014 | Ko et al. | | |

(Continued)

*Primary Examiner* — Pho M Luu
(74) *Attorney, Agent, or Firm* — Hauptman Ham, LLP

(57) ABSTRACT

A memory macro comprises a plurality of columns and a plurality of footers. A column of the plurality of columns comprises a plurality of nodes corresponding to a plurality of memory cells in the column. A footer of the plurality of footers corresponds to each column of the plurality of columns, is coupled with the plurality of nodes of the each column, and, in response to a column select signal of the plurality of columns, is configured to have a first current-sinking capability or a second current-sinking capability different from the first current-sinking capability.

23 Claims, 8 Drawing Sheets

(56) References Cited

U.S. PATENT DOCUMENTS

2014/0241077 A1 8/2014 Katoch et al.
2014/0269114 A1 9/2014 Yang et al.

* cited by examiner

MEMORY ARCHITECTURE

BACKGROUND

In some approaches related to a memory array with a multiplexing scheme, power wastage may result. For illustration, the memory array is configured as a multiplexing of 8, in which eight pairs of bit lines of eight corresponding memory cells are coupled to a multiplexer. In a read operation, one memory cell is read, the other seven memory cells are not read, but eight pairs of bit lines are pre-charged to a high logical value. All eight memory cells then discharge the high logical value of their corresponding bit lines. Discharging the bit lines of the seven memory cells that are not read results in power wastage.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
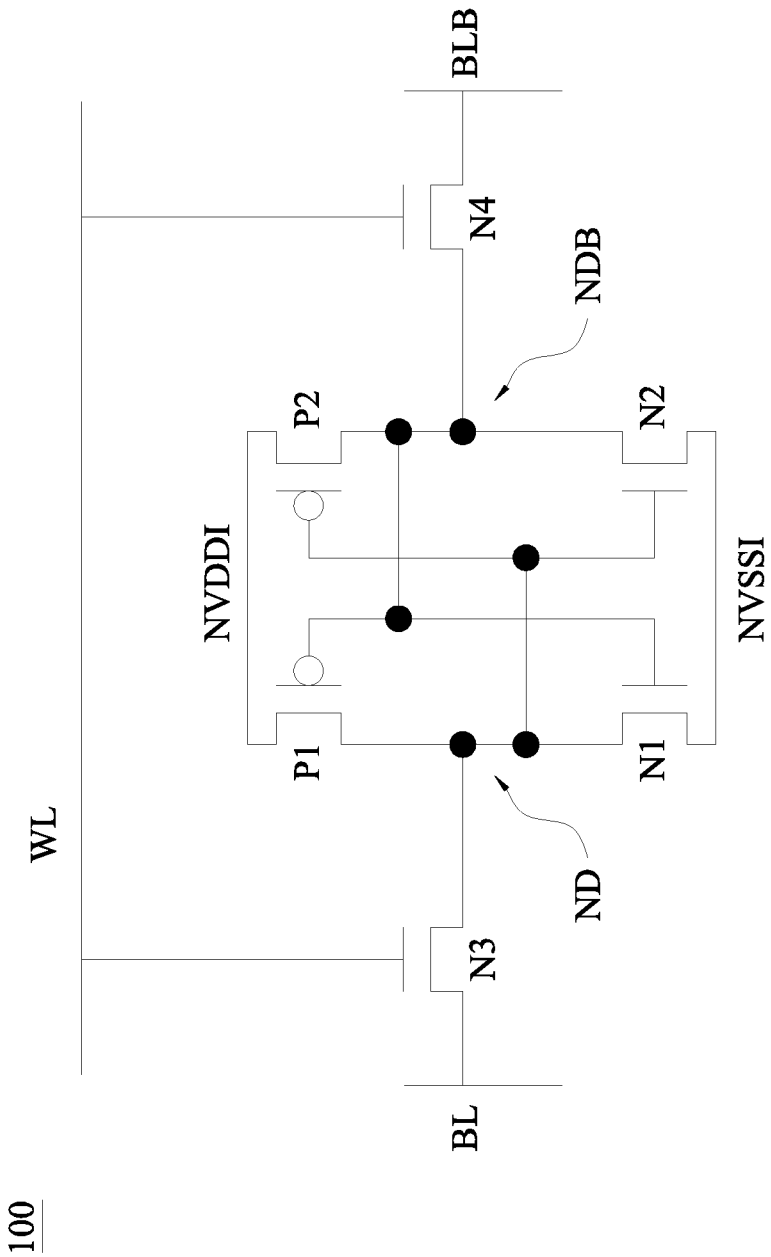
FIG. 1 is a diagram of a memory cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments of the present disclosure have one or a combination of the following features and/or advantages. For illustration, a memory macro has a multiplexing-of-four configuration, which is also called a mux-4 configuration. In a read or write access of one memory cell the other three memory cells are under a dummy read condition. In some embodiments, in a read operation, the column having the memory cell to be read is coupled to a strong footer. In contrast, in a write operation, the column having the memory cell to be written is coupled to a weak footer. The three columns having the three corresponding memory cells under the dummy read condition are coupled to a weak footer for both a read and a write operation. As a result, dynamic power is saved, and is reduced by about 30% compared with some other approaches. Further, in some embodiments, a strong footer is switched to a weak footer some delay after a corresponding word line is activated, to avoid disturbance to data stored in the corresponding memory cell.

Memory Cell

FIG. 1 is a circuit diagram of a memory cell 100, in accordance with some embodiments.

Memory cell 100 includes two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch or cross-coupled inverters. Transistors P1 and N1 form a first inverter while transistors P2 and N2 form a second inverter. Drains of transistors P1 and N1 are coupled together and form a node ND. Drains of transistors P2 and N2 are coupled together and form a node NDB. Gates of transistors P1 and N1 are coupled together and to drains of transistors P2 and N2. Gates of transistors P2 and N2 are coupled together and to drains of transistors P1 and N1. Sources of transistors P1 and P2 are coupled together as a node NVDDI having a supply voltage VDDI (not shown). Sources of transistors N1 and N2 are coupled as a node NVSSI having a supply voltage VSSI (not shown).

A word line WL is coupled with a gate of each of transistors N3 and N4 of memory cell 100. In a memory array, word line WL is coupled with gates of transistors N3 and N4 of a plurality of memory cells 100 in a row of memory cells. Word line WL is also called a control line because the signal on word line WL controls transistors N3 and N4 for data on bit lines BL and BLB to be written to and read from corresponding nodes ND and NDB.

Each of transistor N3 and transistor N4 is called a pass gate transistor. Drains of transistors N3 and N4 are coupled to the pair of bit lines BL and BLB, respectively. In a memory array, bit lines BL and BLB are coupled to each drain of transistors N3 and N4 of a plurality of memory cells 100 in a column of the memory array. Each of bit lines BL and BLB is also called a data line because the data carried on bit lines BL and BLB is written to and read from corresponding nodes ND and NDB.

In a write operation of memory cell 100, data to be written to memory cell 100 is applied to bit lines BL and BLB. Word line WL is then activated to turn on transistors N3 and N4. As a result, the data on bit lines BL and BLB is transferred to, and is stored in, corresponding nodes ND and NDB. For illustration, a low logical value and a high logical value are to be written to nodes ND and NDB, respectively. As a result, corresponding low and high logical values are applied to bit lines BL and BLB to be transferred to corresponding nodes ND and NDB. In some embodiments, both bit lines BL and BLB are pre-charged to a high logical value. Pre-charge refers to charging to a high logical value before writing (or reading). Bit line BL is then pulled to ground or a reference supply voltage VSS to have a low logical value. The corresponding low and logical values on bit line BL and BLB are then transferred to nodes ND and NDB, respectively.

In a read operation of memory cell 100, word line WL is activated to turn on transistors N3 and N4. As a result, the data stored on nodes ND and NDB is transferred to bit lines BL and BLB. The data on bit lines BL and BLB is then processed to indicate the data stored in nodes ND and NDB. For illustration, a low logical value and a high logical value are stored on nodes ND and NDB, respectively. In some embodiments, both bit lines BL and BLB are pre-charged to a high logical value. Word line WL is activated to turn on transistors N3 and N4. The low logical value on node ND causes bit line BL to be logically low. In contrast, bit line BLB remains at the high logical value. Effectively, the low and high logical values stored in nodes ND and NDB are transferred to bit lines BL and BLB, respectively. The low and high logical values on bit lines BL and BLB are then processed to reveal the data stored in nodes ND and NDB, respectively.

Memory Macro

Figure 2:
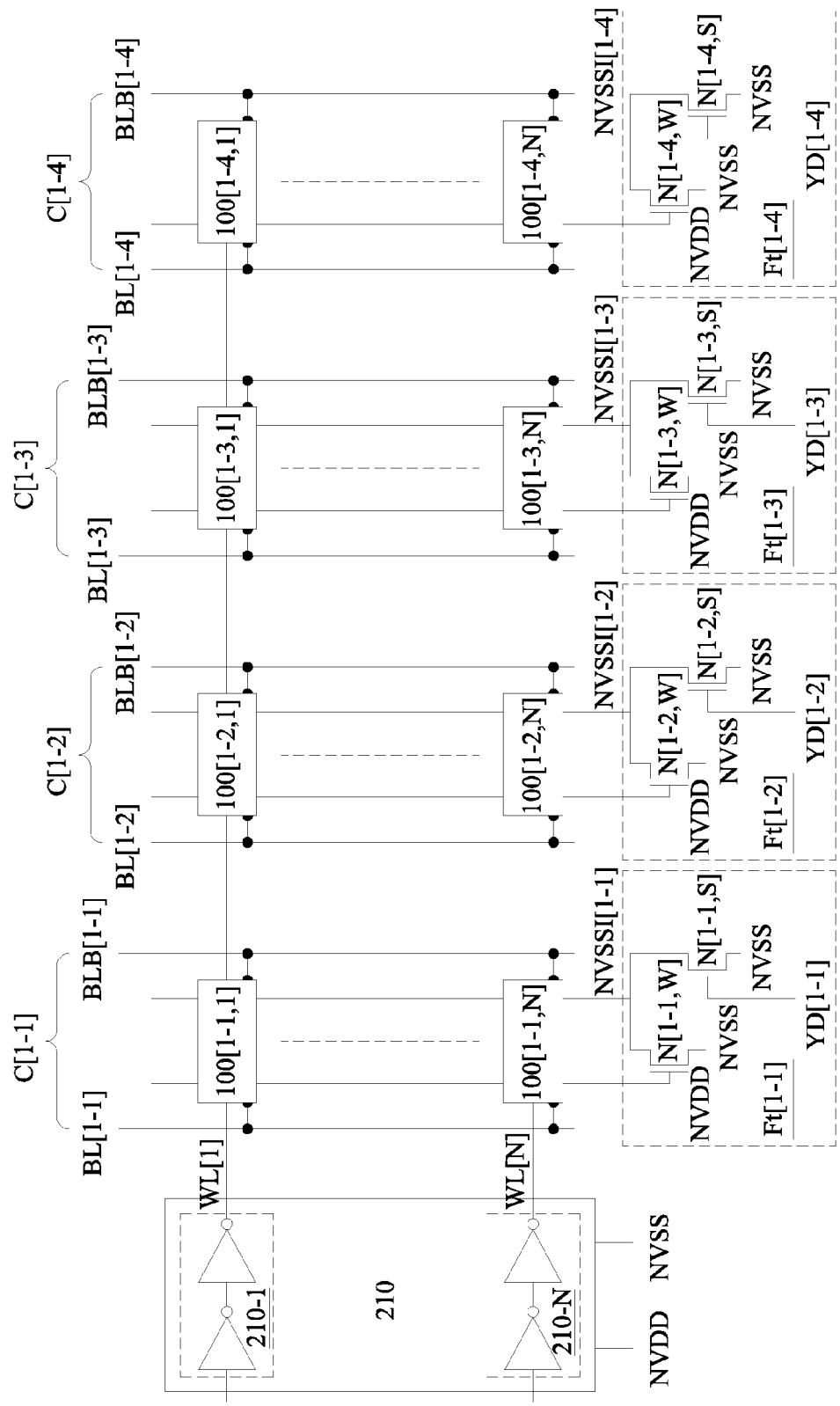
FIG. 2 is a diagram of a memory macro having a plurality of memory cells in FIG. 1, in accordance with some embodiments.

FIG. 2 is a diagram of a memory macro 200, in accordance with some embodiments. Memory macro 200 includes a plurality of memory cells 100 arranged in an array having N rows of memory cells 100 and four columns of memory cells 100 labeled as columns C[1-1], C[1-2], C[1-3], and C[1-4], which is called a mux-4 configuration, and is explained with reference to FIG. 3. Four columns are used for illustration. A different number of columns is within the contemplated scope of the present disclosure. Examples of mux configurations include 8, 16, 64, etc.

Each of word lines WL[1] to WL[N] corresponds to a word line WL in FIG. 1 and a row of memory cells 100 of memory macro 200. N is an integer number indicating memory macro 200 includes N number of rows. Word line driver 210 provides signals to word lines WL[1] to WL[N]. Word line driver 210 includes drivers 210-1 to 210-N corresponding to N rows of memory macro 200. Drivers 210-1 to 210-N each include a pair of inverters. Other circuits in place of the pair of inverters that form a driver 210-1 to 210-N are within the contemplated scope of the present disclosure.

Footers or switching circuits Ft[1-1], Ft[1-2], Ft[1-3], Ft[1-4] each include a pair of NMOS transistors N[1-1,W] and N[1-1,S], N[1-2,W] and N[1-2,S], N[1-3,W] and N[1-3,S], N[1-4,W] and N[1-4,S], respectively. Footers Ft[1-1], Ft[1-2], Ft[1-3], and Ft[1-4] are part of columns C[1-1], C[1-2], C[1-3], and C[1-4], respectively. Depending on operations of transistors in a footer, the footer results in a weak footer or a strong footer of a corresponding column of memory macro 200, as explained below.

Drains of transistors N[1-1,W] and N[1-1,S] are coupled with nodes NVSSI of memory cells 100[1-1,1] to 100[1-1,N] of column C[1-1] through a node NVSSI[1-1] having a voltage VSSI[1-1] (not labeled). Drains of transistors N[1-2,W] and N[1-2,S] are coupled with nodes NVSSI of memory cells 100[1-2,1] to 100[1-2,N] of column C[1-2] through a node NVSSI[1-2] having a voltage VSSI[1-2] (not labeled). Drains of transistors N[1-3,W] and N[1-3,S] are coupled with nodes NVSSI of memory cells 100[1-3,1] to 100[1-3,N] of column C[1-3] through a node NVSSI[1-3] having a voltage VSSI[1-3] (not labeled). Drains of transistors N[1-4,W] and N[1-4,S] are coupled with nodes NVSSI of memory cells 100[1-4,1] to 100[1-4,N] of column C[1-4] through a node NVSSI[1-4] having a voltage VSSI[1-4] (not labeled).

Sources of transistors N[1-1,W], N[1-1, S], N[1-2, W], N[1-2, S], N[1-3,W], N[1-3, S], N[1-4, W], N[1-4, S] are coupled with a node NVSS having a voltage VSS (not labeled). Voltage VSS is used for illustration. Other low logical values, including voltage VSSI, used in place of voltage VSS, are within the contemplated scope of the present disclosure Gates of transistors N[1-1, W], N[1-2, W], N[1-3,W], and N[1-4,W] are each coupled with a node NVDD having a voltage VDD (not labeled). Voltage VDD is used for illustration. Other high logical values, including voltage VDDI, used in place of voltage VDD, are within the contemplated scope of the present disclosure.

Gates of transistors N[1-1, S], N[1-2, S], N[1-3,S], and N[1-4,S] are each configured to receive a control signal YD[1-1], YD[1-2], YD[1-3], and YD[1-4], respectively, from a controller (not shown).

In some embodiments, transistors N[1-1, W], N[1-2, W], N[1-3,W], and N[1-4,W] are each weaker than corresponding transistors N[1-1, S], N[1-2, S], N[1-3,S], and N[1-4,S]. In some embodiments, whether a transistor is weaker or stronger than another transistor is determinable based on at least one of a driving strength, a driving current, a current-sinking capability, or a size of the corresponding transistor. For example, a first transistor is considered weaker than a second transistor if a current-sinking capability of the first transistor is less than that of the second transistor. For another example, a first transistor is weaker than a second transistor if a size of the first transistor is less than that of the second transistor. For illustration, transistors N[1-1, W], N[1-2, W], N[1-3,W], and N[1-4,W] are each called a weak transistor, while transistors N[1-1, S], N[1-2, S], N[1-3,S], and N[1-4,S] are each called a strong transistor.

In some embodiments, voltage VDD has a high logical value. Because voltage VDD is at gates of transistors N[1-1, W], N[1-2, W], N[1-3,W], and N[1-4,W], when macro 200 is in operation, transistors N[1-1, W], N[1-2, W], N[1-3,W], and N[1-4,W] are always turned on. Effectively, columns C[1-1], C[1-2], C[1-3], and C[1-4], by default, are each connected to a corresponding weak footer Ft[1-1], Ft[1-2], Ft[1-3], and Ft[1-4].

When signals YD[1-1], YD[1-2], YD[1-3], and YD[1-4] are each activated, corresponding transistors N[1-1, S], N[1-2, S], N[1-3,S], and N[1-4,S] are turned on. As a result, footer Ft[1-1], Ft[1-2], Ft[1-3], or Ft[1-4] is set to become a strong footer for the corresponding column C[1-1], C[1-2], C[1-3], or C[1-4]. For example, signal YD[1-1] is activated with a high logical value. As a result, transistor N[1-1,S] is turned on. Transistor N[1-1,W] having been turned on, together with the then-turned-on transistor N[1-1,S], provides a stronger current path for column C[1-1], resulting in a strong footer Ft[1-1]. Operations of other footers Ft[1-2], Ft[1-3], and Ft[1-4] are similar. Other circuits to provide a weak or a strong footer to corresponding columns of memory macro 200 are within the contemplated scope of the present disclosure. In some embodiments, transistors N[1-1, W], N[1-2, W], N[1-3,W], or N[1-4,W] are not weaker than corresponding transistors N[1-1, S], N[1-2, S], N[1-3,S], or N[1-4,S]. However, whether each of footer Ft[1-1], Ft[1-2], Ft[1-3], or Ft[1-4] is considered strong or weak depends on the on or off state of the transistors in the corresponding footer Ft[1-1], Ft[1-2], Ft[1-3] or Ft[1-4]. For example, if both transistors N[1-1,S] and N[1-1, W] are turned on, then footer Ft[1-1] is a strong footer. But if only one of transistor N[1-1, W] or N[1-1,S] is on, then footer Ft[1-1] is a weak footer.

Multiplexing

Figure 3:
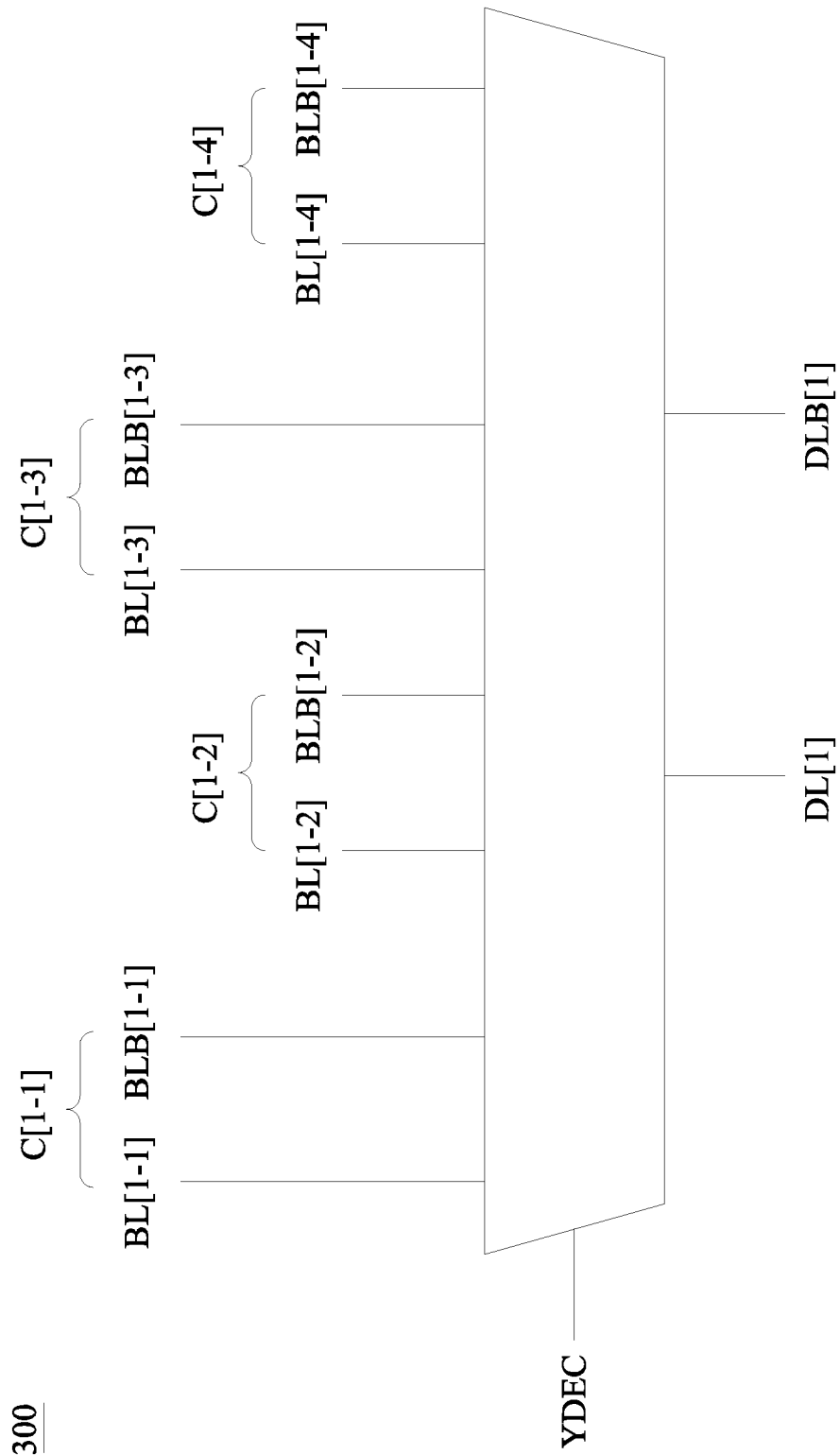
FIG. 3 is a diagram of a selection circuit used in conjunction with the memory macro of FIG. 2, in accordance with some embodiments.

FIG. 3 is a diagram of a selection circuit in the form of a multiplexer 300, in accordance with some embodiments. A signal YDEC is generated based on a corresponding decoder circuit (not shown), and is used for multiplexer 300 to select a pair of bit lines BL[1-1], BLB[1-1] of column C[1-1], a pair of bit lines BL[1-2], BLB[1-2] of column C[1-2], a pair of bit lines BL[1-3], BLB[1-3] of column C[1-3], or a pair of bit lines BL[1-4], BLB[1-4] of column C[1-4] to correspond to a pair of data lines DL[1], DLB[1]. For example, in a read operation, the data on a pair of bit lines BL[1-1], BLB[1-1], a pair of bit lines BL[1-2], BLB[1-2], a pair of bit lines BL[1-3], BLB[1-3], or a pair of bit lines BL[1-4], BLB[1-4] is provided to the pair of data lines DL[1] and DLB[1]. In contrast, in a write operation the data on the pair of data lines DL[1] and DLB[1] is provided to a pair of bit lines BL[1-1], BLB[1-1], a pair of bit lines BL[1-2], BLB[1-2], a pair of bit lines BL[1-3], BLB[1-3], or a pair of bit lines BL[1-4], BLB[1-4].

In some embodiments, at least one other selection circuit (not shown) similar to selection circuit 300 is used to select an additional corresponding column together with one of columns C[1-1], C[1-2], C[1-3], or C[1-4]. For illustration, memory macro 200 includes additional columns C[2-1], C[2-2], C[2-3], and C[2-4] with corresponding pairs of bit lines BL[2-1], BLB[2-1]; BL[2-2], BLB[2-2]; BL[2-3], BLB[2-3]; and BL[2-4], BLB[2-4]. Further, a multiplexer 300' (not shown) similar to multiplexer 300, is used to select a pair of bit lines BL[2-1], BLB[2-1], a pair of bit lines BL[2-2], BLB[2-2], a pair of bit lines BL[2-3], BLB[2-3] of column C[2-3], or a pair of bit lines BL[2-4], BLB[2-4] to correspond to a pair of data lines DL[2], DLB[2] (not shown). In some embodiments, pairs of bit lines BL[1-1], BLB[1-1] and BL[2-1], BLB[2-1] are selected at the same time. Similarly, pairs of bit lines BL[1-2], BLB[1-2] and BL[2-2], BLB[2-2] are selected at the same time; pairs of bit lines BL[1-3], BLB[1-3] and BL[2-3], BLB[2-3] are selected at the same time; and pairs of bit lines BL[1-4], BLB[1-4] and BL[2-4], BLB[2-4] are selected at the same time.

Four columns coupled with a corresponding multiplexer 300 or 300' are for illustration, and are called multiplexing of four. A different number of columns coupled with a multiplexer is within the contemplated scope of the present disclosure. In other words, multiplexing a number different from four is within the contemplated scope of the present disclosure. Examples of multiplexing include multiplexing of 8, 16, etc.

Two multiplexers 300 and 300' are used for illustrations. A different number of multiplexers is within the contemplated scope of the present disclosure. The number of multiplexers depends on the number of columns and the multiplexing architecture of memory macro 200. For example, if memory macro 200 includes 64 columns with a multiplexing-of-4 architecture, 16 (=64/4) multiplexers would be used. If memory macro 200 includes 64 columns with a multiplexing-of-8 architecture, 8 (=64/8) multiplexers would be used, etc.

Waveforms

In some embodiments, a memory cell under a read operation or a write operation causes a dummy read to memory cells coupled to the same word line with the memory cell under the read or write operation. For illustration, an integer i is a number between 1 and N, and memory cell 100[1-1,i] is under a read or write operation. As a result, word line WL[i] is activated during the read or write operation and causes a dummy read to memory cells coupled to word line WL[i], including memory cells 100[1-2, i], 100[1-3,i], and 100[1-4,i]. In some embodiments, memory cells in a column that has a memory cell under a dummy read condition are configured to have a weak footer for both a read and a write operation.

Figure 4A:
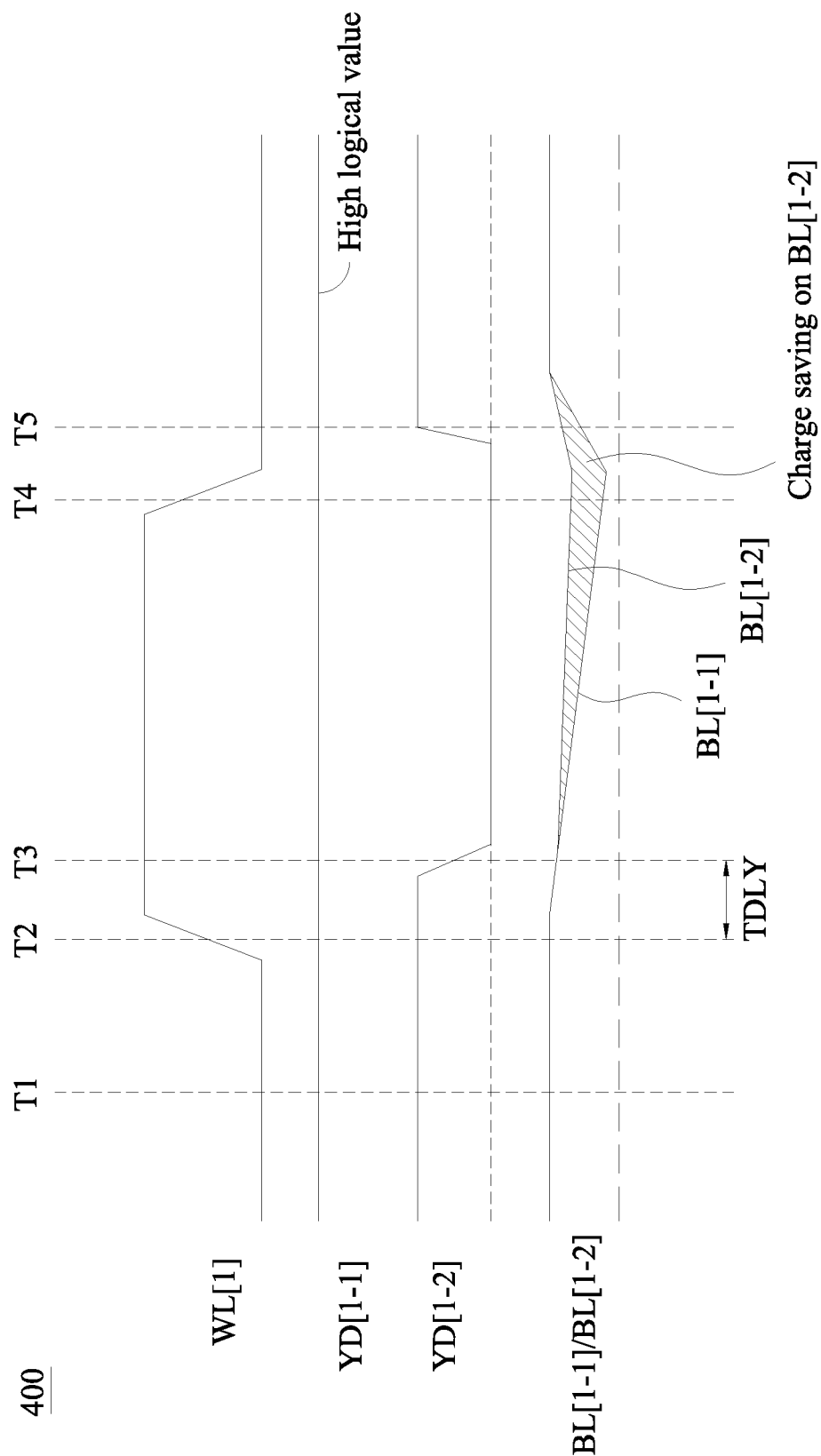
FIG. 4A is a graph of waveforms illustrating a read operation of the memory macro in FIG. 2, in accordance with some embodiments.

FIG. 4A is a graph of waveforms 400, in accordance with some embodiments. Waveforms 400 are used to illustrate a read operation of memory cell 100[1-1,1]. For illustration, memory cell 100[1-1,1] has a low logical value and a high logical value on nodes ND and NDB, respectively. Memory cell 100[1-1,1] is then read. Waveforms 400 illustrate operations of columns C[1-1] and C[1-2]. Operations of other columns are similar. For example, operations of column C[2-1] is similar to those of column C[1-1], and operations of columns C[1-3], C[1-4], C[2-2], C[2-3], and C[2-4] are similar to those of column C[1-2]. In some embodiments, when a memory cell is read, the corresponding column having the memory cell is coupled to a corresponding strong footer, while other columns are coupled to corresponding weak footers. In such a condition, the strong footer draws a larger current and provides a high speed to read the memory cell. In contrast, the other columns experience less current. As a result, power consumption by the corresponding memory macro is reduced. In the example of FIG. 4A, column C[1-1] is coupled to a strong footer Ft[1-1], while other columns, such as, C[1-2], C[1-3], C[1-4], C[2-2], C[2-3], C[2-4], etc., are coupled to a corresponding weak footer.

For further illustration, before and up to time T2, such as at time T1, word line WL[1] is deactivated with a low logical value. As a result, memory cells on row 1 are in a standby mode. At time T2, word line WL[1] is activated with a high logical value, and memory cell 100[1-1,1] in column C[1-1] is under a read operation. Because word line WL[1] is active and word line WL[1] is also coupled with memory cell 100[1-2,1] in column C[1-2], memory cell 100[1-2, 1] is under a dummy read condition.

With references to the signals, signal YD[1-1] is applied with a high logical value during the example of FIG. 4A. As a result, transistor N[1-1,S] is turned on, and, together with transistor N[1-1,W], provides a strong footer Ft[1-1] for column C[1-1]. Because the source of transistor N1 of memory cell 100[1-1,1] is coupled with footer Ft[1-1], footer Ft[1-1], through transistor N1 of memory cell 100[1-1,1], continues to pull node ND of memory cell 100[1-1,1] to a low logical value. At time T1, because signal YD[1-2] is also active with a high logical value, transistor N[1-2,S] of column C[1-2] is turned on and footer Ft[1-2] is also a strong footer.

At time T2, because word line WL[1] is activated, transistor N3 of memory cell 100[1-1,1] is turned on. As a result, footer Ft[1-1], through transistors N3 and N1, starts to discharge or pull bit line BL[1-1] of memory cell 100[1-1,1] towards a low logical value. A time delay TDLY between time T2 and time T3 will be explained below.

Between time T2 and time T3, because signal YD[1-2] is logically high, transistor N[1-2,S] of column C[1-2] is also turned on similar to transistor N[1-1,S] of column C[1-1] being turned on. As a result, bit line BL[1-2] of memory cell 100[1-2,1] behaves in a manner similar as bit line BL[1-1] of memory cell 100[1-1,1]. As illustratively shown in FIG. 4A, before and up to time T3, bit lines BL[1-1] and BL[1-2] are shown to be represented by the same line.

At time T3, signal YD[1-2] is applied with a low logical value. Transistor N[1-2,S] of column C[1-2] is therefore turned off, acts as an open circuit, and has no electrical effect on node NVSSI[1-2]. Effectively, transistor N[1-2,W] has been on, and footer Ft[1-2] is set to act as a weak footer Ft[1-2] for column C[1-2].

With reference to memory cell 100[1-2,1], node NVSSI is coupled with footer Ft[1-2]. Further, because word line WL[1] is activated, transistor N3 of memory cell 100[1-2,1] is turned on. As a result, footer Ft[1-2], through transistors N3 and N1, discharges or pulls bit line BL[1-2] of memory cell 100[1-2,1] towards a low logical value. When comparing bit line BL[1-1] with bit line BL[1-2], because footer Ft[1-1] is stronger than footer Ft[1-2], bit line BL[1-1] is discharged faster than bit line BL[1-2]. Explained in a different way, memory cell 100[1-2,1] draws less current than memory cell [1-1,1].

At time T4, word line WL[1] is de-activated. At time T5, signal YD[1-2] transitions to a high logical value. As a result, transistor N[1-2, S] is turned on, and column C[1-2] is coupled to a strong footer Ft[1-2]. After time T5 memory cells on row 1 are in a standby mode similar to before and up to time T1.

With reference to time delay TDLY in FIG. 4A, signal YD[1-2] is deactivated a time delay TDLY after time T2 when word line WL[1] is activated to prevent data upset in memory cell 100[1-2,1]. For example, at time T2 after word line WL[1] is activated and transistor N3 of memory cell 100[1-2,1] is turned on, a high logical value of bit line BL[1-2] causes a voltage increase or a voltage bump on node ND of memory cell 100[1-2,1]. As a result, during the voltage bump between time T2 and time T3, memory cell 100[1-2,1] is continued to be connected to a strong footer to reduce and/or eliminate a chance for the data on node ND to be disturbed by the voltage bump. In some embodiments, time TDLY is obtained by simulation. For example, the duration of the voltage bump is observed and/or mathematically calculated, and a time TDLY is selected to avoid the effect of the voltage bump.

Figure 4B:
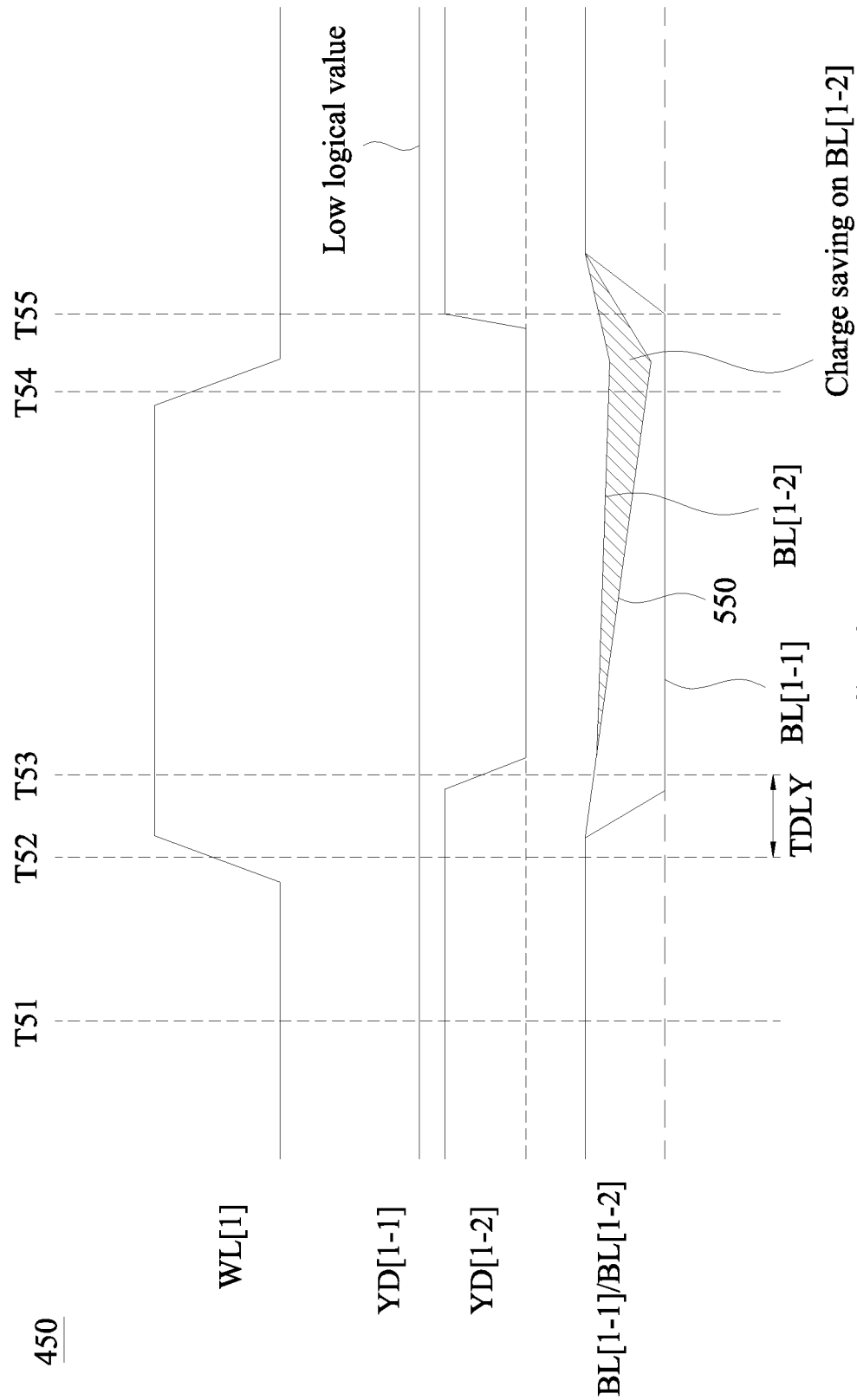
FIG. 4B is a graph of waveforms illustrating a write operation of the memory macro in FIG. 2, in accordance with some embodiments.

FIG. 4B is a graph of waveforms 450, in accordance with some embodiments. Waveforms 450 are used to illustrate a write operation of memory cell 100[1-1,1]. For illustration, memory cell 100[1-1,1] is to be written with a low and a high logical value to nodes ND and NDB, respectively. Waveforms 450 illustrate operations of columns C[1-1] and C[1-2]. Operations of other columns are similar. For example, operations of column C[2-1] is similar to those of column C[1-1], and operations of columns C[1-3], C[1-4], C[2,2], C[2,3], and C[2,4] are similar to those of column C[1-2]. In some embodiments, when data is written to a memory cell, the corresponding column and other columns are coupled to corresponding weak footers. In such a condition, the less current drawn by the weak footers help to write to the memory cell faster. In the example of FIG. 4B, in a write operation both columns C[1-1] and C[1-2] are coupled to corresponding weak footers Ft [1-1] and Ft[1-2].

Line 550 represents bit line BL[1-2] in other approaches being coupled to a strong footer, e.g., a footer that has a current-driving capability higher than that of a weak footer coupled to bit line BL[1-2] in various embodiments of the present disclosure.

For further illustration, before and up to time T52, such as at time T51, word line WL[1] is deactivated with a low logical value. As a result, memory cells on row 1 are in a standby mode. At time T52, word line WL[1] is activated with a high logical value, and memory cell 100[1-1,1] in column C[1-1] is under a write operation. Because word line WL[1] is active and word line WL[1] is also coupled with memory cell 100[1-2,1] in column C[1-2], memory cell 100[1-2, 1] is under a dummy read condition.

With references to the signals, for illustration, signal YD[1-1] is logically low. As a result, transistor N[1-1,S] of column C[1-1] is turned off, and column C[1-1] is coupled to a weak footer Ft[1-1] comprising transistor N[1-1,W] being turned on. Additionally, signal YD[1-2] is logically high. As a result, transistor N[1-2,S] of column C[1-2] is turned on, which, together with transistor N[1-2,W], causes footer Ft[1-2] to function as a strong footer for column C[1-2].

Between time T52 and time T53, a write driver (not shown) drives bit line BL[1-1] to a low logical value. Further, because word line WL[1] is active, bit line BL[1-2] discharges towards a low logical value.

At time T53, signal YD[1-2] is applied with a low logical value. Transistor N[1-2,S] of column C[1-2] is therefore turned off, acts as an open circuit, and has no electrical effect on node NVSSI[1-2]. Effectively, transistor N[1-2,W] has been on, and footer Ft[1-2] is set to act as a weak footer Ft[1-2] for column C[1-2]. Further, column C[1-1] is also coupled with a weak footer as explained above. As a result, both columns C[1-1] and C[1-2] are coupled to corresponding weak footers. In some embodiments, in a write operation, all columns of memory macro 200 are configured to have a weak footer.

With reference to memory cell 100[1-2,1], node NVSSI is coupled with weak footer Ft[1-2]. Further, because word line WL[1] is activated, transistor N3 of memory cell 100[1-2,1] is turned on. As a result, footer Ft[1-2], through transistors N3 and N1, discharges or pulls bit line BL[1-2] of memory cell 100[1-2,1] towards a low logical value. When comparing bit line BL[1-2] with line 550, because the footer in other approaches is stronger than footer Ft[1-2], line 550 is discharged faster than bit line BL[1-2]. Explained in a different way, memory cell 100[1-2,1] draws less current than memory cell [1-2,1] in other approaches, and is therefore advantageous over other approaches.

At time T54, word line WL[1] is de-activated. At time T55, signal YD[1-2] transitions to a high logical value. As a result, transistor N[1-2, S] is turned on, and column C[1-2] is coupled to a strong footer Ft[1-2]. After time T55 memory cells on row 1 are in a standby mode similar to before and up to time T51.

In the illustration of FIG. 4B, signal YD[1-1] is logically low for illustration. In some embodiments, signal YD[1-1] behaves similarly to signal YD[1-2]. In other words, both signals YD[1-1] and YD[1-2] are logically low or high at the same time such that in a write operation both columns C[1-1] and C[1-2] are both logically low.

Similar to FIG. 4A, in FIG. 4B, signal YD[1-2] is deactivated a time delay TDLY after time T52 when word line WL[1] is activated to prevent data upset in memory cell 100[1-2,1].

Various embodiments of the present disclosure are advantageous over other approaches. For example, in various other approaches, there is no distinction between a weak footer and a strong footer as in various embodiments of the present disclosure. In those other approaches, during a read or write operation of a memory cell in column C[1-1], columns C[1-1] and C[1-2] are coupled with two footers that correspond to footers Ft[1-1] and Ft[1-2] and that have the same or similar current-sinking capability. In contrast, in various embodiments of the present disclosure, between times T3 and T4, column C[1-1] under a read operation is coupled with a strong footer, which speeds up the read time on bit line BL[1-1]. On the other hand, column C[1-2] under a dummy read condition is coupled with a weak footer, which draws less current. As a result, in various embodiments of the present disclosure power consumption is reduced. For example, in FIG. 4A, in other approaches, because bit line BL[1-2] would be coupled to a footer having similar current-sinking capability as that of bit line BL[1-1], bit line BL[1-2] in other approaches would be discharged similar to bit line BL[1-1] and draw the same amount of current as bit line BL[1-1]. In contrast, in various embodiments of the present disclosure, because bit line BL[1-2] is coupled to a weak footer, bit line BL[1-2] does not draw as much current as bit line BL[1-1]. Consequently, the area bounded by bit lines BL[1-1] and BL[1-2] represents the charge saving by bit line BL[1-2]. Similarly, with references to FIG. 4B the area bounded by bit line BL[1-2] and line 550 represents the charge saved by bit line BL[1-2] because bit line BL[1-2] is coupled to a weak footer. In the above example, column C[1-2] is used as an example. With reference to multiplexer 300, current consumption of columns C[1-3] and C[1-4] are also reduced. Effectively, in various embodiments of the present disclosure, with reference to a particular multiplexer, power consumption in columns having memory cells under a dummy read condition is reduced.

Footer Connection

Figure 5:
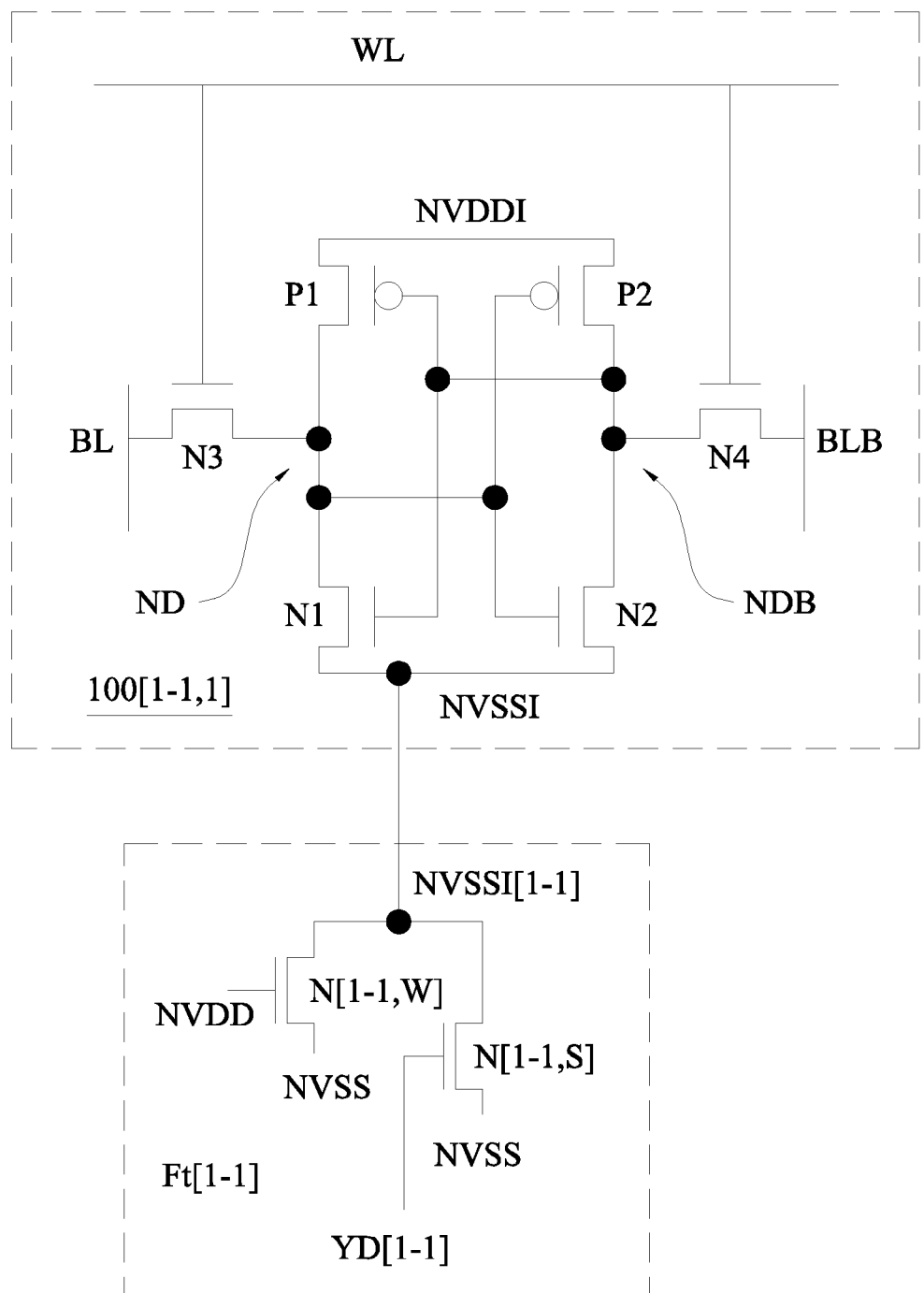
FIG. 5 is a diagram of a circuit illustrating a connection between a 6T memory cell and a footer of a column of the memory macro in FIG. 2, in accordance with some embodiments.

FIG. 5 is a diagram of a circuit 500, in accordance with some embodiments. Circuit 500 is used to illustrate a connection between memory cell 100[1-1,1] and footer Ft[1-1]. For example, node NVSSI of memory cell 100[1-1,1] is coupled with node NVSSI[1-1] at the drains of transistors N[1-1,W] and N[1-1,S]. Connections of other memory cells to corresponding footers are similar.

8T Memory Cells

In the above illustrations, memory cell 100 in FIG. 1 includes 6 transistors N1, N2, N3, N4, P1, and P2, and is called a 6T memory cell. Other types of memory cells are within the contemplated scope of the present disclosure. For example, a memory cell in some other embodiments of the present disclosure includes 8 transistors, and is called an 8T memory cell. For illustration, a memory macro 200' (not shown) is similar to memory macro 200 except that 6T memory cells 100 in memory macro 200 are replaced by 8T memory cells to form memory macro 200'. The configuration of memory macro 200' is the same as that of memory macro 200 with additional configurations of the 8T memory cells. In additions, footers Ft6 (in FIG. 6) in memory macro 200' are different from footers Ft in memory macro 200 to adapt to the 8T memory cells of memory macro 200'.

Figure 6:
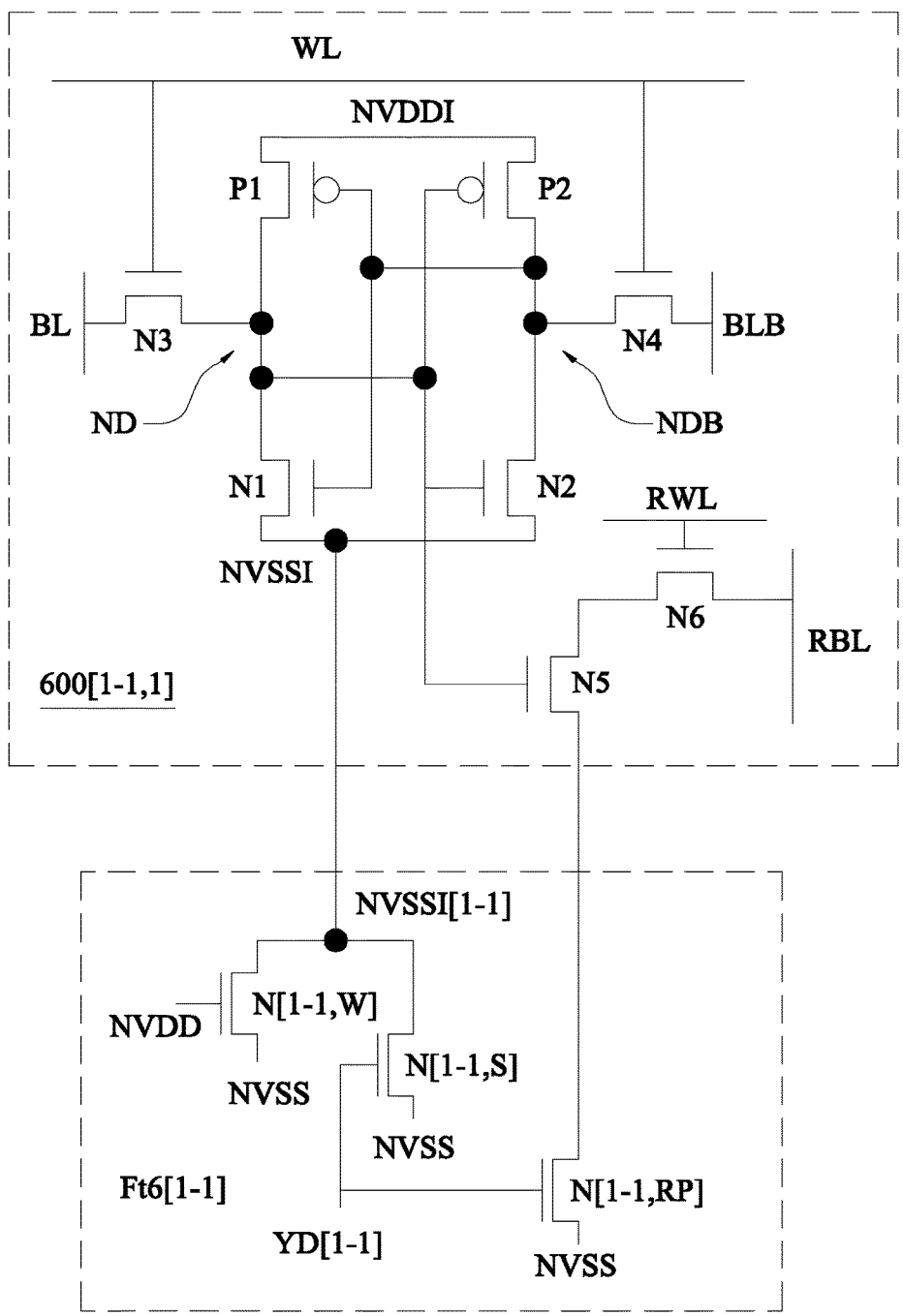
FIG. 6 is a diagram of a circuit illustrating a connection between an 8T memory cell and a corresponding footer, in accordance with some embodiments.

FIG. 6 is a diagram of a circuit 610 illustrating a connection between an 8T memory cell 600[1-1, 1] and a corresponding footer Ft6[1-1], in accordance with some embodiments.

Details of an 8T memory cell coupled with a corresponding footer Ft6 are explained with reference to circuit 610 in FIG. 6. For example, circuit 610 is a circuit diagram used to illustrate a connection between a memory cell 600[1-1, 1] and a footer Ft6[1-1] of column C[1-1] of memory macro 200'. Connections between other memory cells of memory macro 200' and corresponding footersFt6 are similar.

Compared with memory cell 100[1-1, 1] in FIG. 5, memory cell 600[1-1,1] in FIG. 6 includes additional transistors N5, N6, read word line RWL, and read bit line RBL, which altogether form a read port for memory cell 600[1-1,1]. In some embodiments, read word line RWL is coupled with a plurality of memory cells 600 in a row of a memory array of memory macro 200'. Further, read bit line RBL is coupled with a plurality of memory cells 600 in a column of the memory array.

Compared with footer Ft[1-1] in FIG. 5, footer Ft6[1-1] includes an additional transistor N[1-1,RP]. A drain of transistor N[1-1, RP] is coupled with a source of transistor N5 of memory cell 600[1-1,1]. A source of transistor N[1-1,RP] is coupled with node NVSS. A gate of transistor N[1-1,RP] is configured to receive signal YD[1-1], which is also at the gate of transistor N[1-1,S].

In some embodiments, a write operation of memory cell 600[1-1,1] is similar to that of memory cell 100[1-1,1] in FIG. 5. Further, in a read operation of memory cell 600[1-1,1], read bit line RBL is pre-charged to a high logical value, and read word line RWL is activated with a high logical value to turn on transistor N6. Signal YD[1-1] is activated to turn on transistor N[1-1,RP]. The data stored in node ND then turns on or off transistor N5, which affects a voltage level on read bit line RBL. Determining the voltage value on read bit line RBL reveals the data stored in node ND. For example, if node ND stores a high logical value, the high logical value of node ND turns on transistor N5. As a result, transistor N5, together with the then-turned-on transistors N6 and N[1-1,RP], pulls read bit line RBL to voltage VSS on node NVSS or a low logical value at the source of transistor N5 and N[1-1,RP]. Effectively, read bit line RBL being logically low reveals that node ND stores a high logical value. In contrast, if node ND stores a low logical value, the low logical value of node ND turns off transistor N5, and causes transistor N6 to act as an open circuit. As a result, read bit line RBL stays at the high logical value of the pre-charge value. In other words, read bit line RBL being logically high reveals that node ND stores a low logical value.

In some embodiments, when memory cell 600[1-1,1] is in a read, signal YD[1-1] is activated with a high logical value. As a result, both transistors N[1-1,S] and N[1-1,RP] of footer Ft6[1-1] are turned on, and results in footer Ft6[1-1] being a strong footer. In contrast, when memory cell 600[1-1,1] is in a dummy read condition, signal YD[1-1] is de-activated with a low logical value. As a result, both transistors N[1-1,S] and N[1-1,RP] of footer Ft6[1-1] are turned off, and results in footer Ft6[1-1] being a weak footer. Further, because transistor N[1-1,RP] is turned off, transistor N[1-1, RP] functions as an open circuit, and results in transistors N5 and N6 also functioning as an open circuit. Effectively, the read port of memory cell 600[1-1,1] being completely off.

Figure 7:
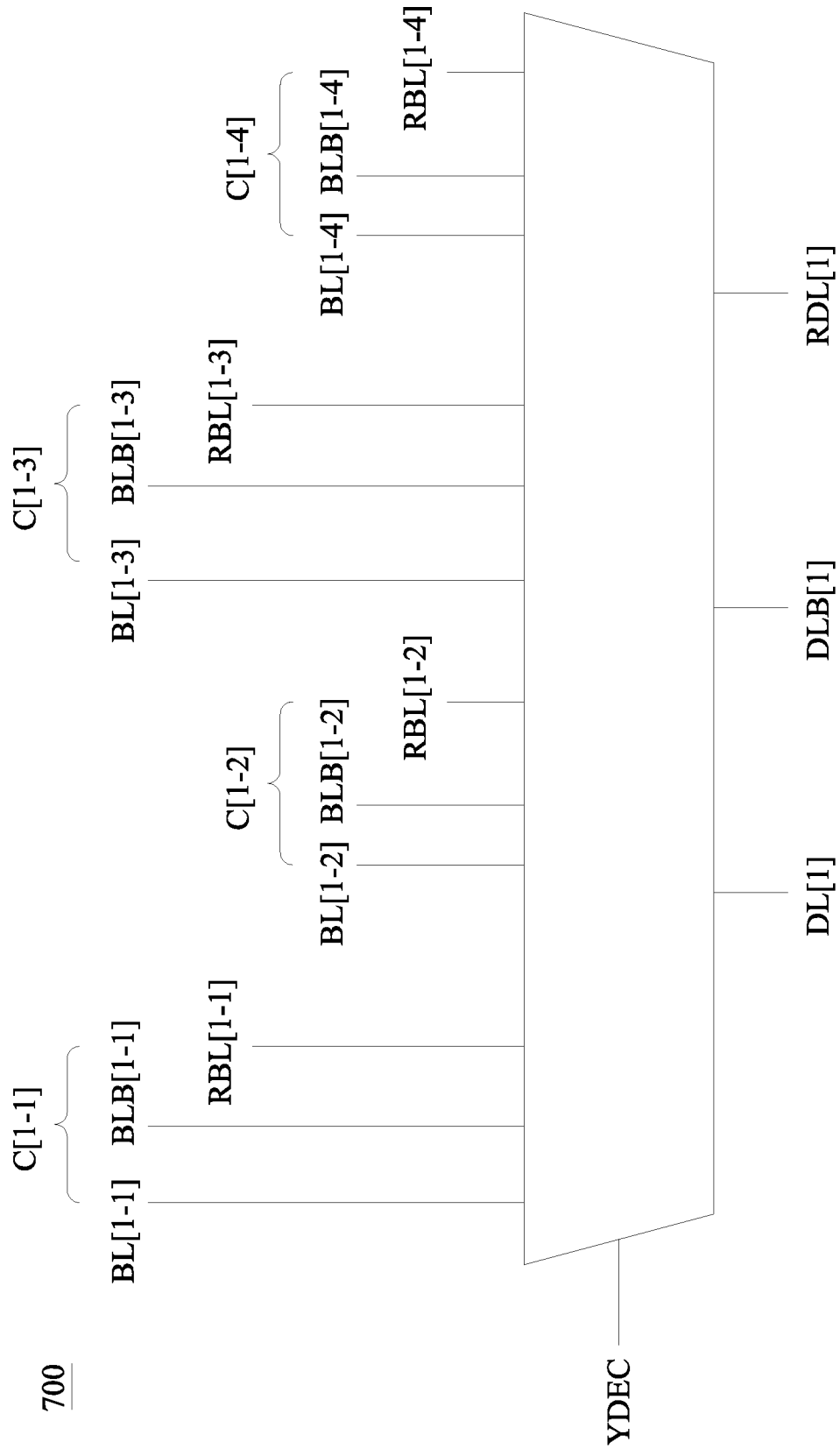
FIG. 7 is a diagram of a selection circuit used in a memory macro, in accordance with some embodiments.

FIG. 7 is a diagram of a selection circuit in the form of a multiplexer 700, in accordance with some embodiments. Compared with multiplexer 300, multiplexer 700 receives additional read bit lines RBL[1-1], RBL[1-2], RBL[1-3], and RBL[1-4] of columns C[1-1], C[1-2], C[1-3], and C[1-4], respectively. Further, multiplexer 700 additionally selects read bit lines RBL[1-1], RBL[1-2], RBL[1-3], and RBL[1-4] to provide data to read bit line or read data line RDL[1].

In some embodiments, a memory macro comprises a plurality of columns and a plurality of footers. A column of the plurality of columns comprises a plurality of nodes corresponding to a plurality of memory cells in the column. A footer of the plurality of footers corresponds to each column of the plurality of columns, is coupled with the plurality of nodes of the each column, and, in response to a column select signal of the plurality of columns, is configured to have a first current-sinking capability or a second current-sinking capability different from the first current-sinking capability.

In a method of some embodiments, based on a plurality of columns selectively chosen by a selection circuit in a memory macro, a first column having a first memory cell under a read operation is provided with a first current-sinking capability by a first footer. Each of the rest of the plurality of columns is provided with a second current-sinking capability by a corresponding footer. The first current sinking capability is different from the second current-sinking capability.

In a method of some embodiments, based on a plurality of columns in a memory macro, each column corresponding to a footer configurable to provide a first current-sinking capability or a second current-sinking capability higher than the first current-sinking capability, each of the plurality of columns is provided with a first current-sinking capability by a corresponding footer; and a write access is performed on the first memory cell in a column of the plurality of columns.

In some embodiments, a memory circuit comprises a plurality of pairs of data lines, a selection circuit, a plurality of columns, and a plurality of footers. The selection circuit is coupled with the plurality of pairs of data lines. A column of the plurality of columns comprises a plurality of nodes corresponding to a plurality of memory cells in the column. The plurality of memory cells in the column is coupled with a pair of data lines of the plurality of pairs of data line. Each footer of the plurality of footers corresponds to each column of the plurality of columns, is coupled with the plurality of nodes of the each column, and, in response to a column select signal of the plurality of columns, is configured to have a first current-sinking capability or a second current-sinking capability different from the first current-sinking capability.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or de-activated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. In various embodiments, a signal is provided by a signal source, but, for simplicity, the signal source is not shown.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A memory macro comprising:
   a plurality of columns; and
   a plurality of footers,
   wherein
   a column of the plurality of columns comprises a plurality of nodes corresponding to a plurality of memory cells in the column; and
   each footer of the plurality of footers corresponds to each column of the plurality of columns, is coupled with the plurality of nodes of the each column, and, in response to a column select signal of the plurality of columns, is configured to have a first current-sinking capability or a second current-sinking capability different from the first current-sinking capability, wherein
   a first footer of the plurality of footers comprises:
      a first switch configured to close in response to a state of a first switch control signal, and
      a second switch configured to receive a second switch control signal, different from the first switch control signal.

2. The memory macro of claim 1, wherein
   the first footer comprises
      a first N-type transistor having a first source, a first gate, and a first drain; and
      a second N-type transistor having a second source, a second gate, and a second drain;
   the first drain and the second drain are coupled to the nodes;
   the first source and the second source are coupled to a reference voltage node;
   the first gate is configured such that the first transistor is turned on when the memory macro is turned on; and
   the second gate is configured to receive the second switch control signal.

3. The memory macro of claim 1, wherein
   the first footer comprises
      a first N-type transistor having a first source, a first gate, and a first drain; and
      a second N-type transistor having a second source, a second gate, and a second drain;
      a third N-type transistor having a third source, a third gate, and a third drain;
   the first drain and the second drain are coupled to the nodes;
   the first source, the second source, and the third source are coupled to a reference voltage node;
   the first gate is configured such that the first transistor is on when the memory macro is on;
   the second gate and the third gate are configured to receive the second switch control signal; and
   the third drain is coupled with read ports of the plurality of memory cells in the column.

4. The memory macro of claim 1, comprising:
   a first column including the first footer, wherein the first footer is configured to have the first current-sinking capability when a first memory cell in the first column is under a read operation; and
   a second footer in a second column configured to have the second current-capability when a second memory cell in the second column is under a dummy read condition,
   wherein the first current-sinking capability is higher than the second current-sinking capability.

5. The memory macro of claim 4 wherein the second footer in the second column is configured to have the second current-sinking capability after a time delay from a time a word line of the first memory cell in the first column is activated.

6. The memory macro of claim 4 comprising a plurality of word lines,
   wherein
   a word line of the plurality of word lines is coupled with the first memory cell and with the second memory cell.

7. The memory macro of claim 4 comprising a selection circuit coupled with the first column and the second column.

8. The memory macro of claim 1 comprising a plurality of selection circuits, wherein a selection circuit of the plurality of selection circuits is coupled with the plurality of columns.

9. The memory macro of claim 1, comprising a plurality of memory cells, each of which includes a 6-transistor memory cell or an 8-transistor memory cell.

10. A method comprising:
based on a plurality of columns in a memory macro,
by a first footer, providing a first column having a first memory cell under a read operation with a first current-sinking capability, wherein the first current-sinking capability is based on a state of a first switch control signal and a state of a second switch control signal, wherein the first switch control signal is different from the second switch control signal; and
providing each of the rest of the plurality of columns with a second current-sinking capability by a corresponding footer,
wherein the first-current sinking capability is different from the second-current sinking capability.

11. The method of claim 10, wherein a second memory cell in the each of the rest of the plurality of columns is under a dummy read condition.

12. The method of claim 10, wherein the first current-sinking capability is higher than the second current-sinking capability.

13. The method of claim 10, wherein
providing the first column having the first memory cell under the read operation with a first current-sinking capability comprises turning on a first transistor of the first footer; and
providing each of the rest of the plurality of columns with a second current-sinking capability by the corresponding footer comprises turning off a second transistor of the corresponding footer.

14. The method of claim 13, wherein
turning off the second transistor of the corresponding footer is performed a time delay after a word line of the first memory cell is activated.

15. The method of claim 13, wherein
the first footer comprises a third transistor;
drains of the first transistor and of the third transistor are coupled to nodes of a plurality of memory cells in the first column;
the corresponding footer comprises a fourth transistor; and
drains of the second transistor and of the fourth transistor are coupled to nodes of a plurality of memory cells in each of the rest of the plurality of columns.

16. A memory circuit comprising:
a plurality of pairs of data lines;
a selection circuit;
a plurality of columns; and
a plurality of footers,
wherein
the selection circuit is coupled with the plurality of pairs of data lines;
a column of the plurality of columns comprises a plurality of nodes corresponding to a plurality of memory cells in the column;
the plurality of memory cells in the column is coupled with a pair of data lines of the plurality of pairs of data lines; and
each footer of the plurality of footers corresponds to each column of the plurality of columns, is coupled with the plurality of nodes of the each column, and, in response to a column select signal of the plurality of columns, is configured to have a first current-sinking capability or a second current-sinking capability different from the first current-sinking capability, wherein
a footer of the plurality of footers comprises:
a first switch configured to close in response to a state of a first switch control signal, and
a second switch configured to receive a second switch control signal, wherein the second switch control signal is different from the first switch control signal.

17. The memory circuit of claim 16, wherein
the footer of the plurality of footers comprises
a first N-type transistor having a first source, a first gate, and a first drain; and
a second N-type transistor having a second source, a second gate, and a second drain;
the first drain and the second drain are coupled to the nodes;
the first source and the second source are coupled to a reference voltage node;
the first gate is configured such that the first transistor is turned on when the memory macro is turned on; and
the second gate is configured to receive the second switch control signal.

18. The memory circuit of claim 17, wherein a memory cell of the plurality of memory cells is a 6T memory cell.

19. The memory circuit of claim 16, wherein
the footer comprises
a first N-type transistor having a first source, a first gate, and a first drain;
a second N-type transistor having a second source, a second gate, and a second drain; and
a third N-type transistor having a third source, a third gate, and a third drain;
the first drain and the second drain are coupled to the nodes;
the first source, the second source, and the third source are coupled to a reference voltage node;
the first gate is configured such that the first transistor is on when the memory macro is on;
the second gate and the third gate are configured to receive the second switch control signal; and
the third drain is coupled with read ports of the plurality of memory cells in the column.

20. The memory circuit of claim 19, wherein a memory cell of the plurality of memory cells is an 8T memory cell.

21. A method comprising:
based on a plurality of columns in a memory macro, each column corresponding to a footer configurable to provide a first current-sinking capability or a second current-sinking capability higher than the first current-sinking capability,
providing each of the plurality of columns with either the first or second current-sinking capability by a corresponding footer, wherein the first current-sinking capability is based on a state of a first switch control signal and a state of a second switch control signal, wherein the first switch control signal is different from the second switch control signal; and
accessing a first memory cell in a column of the plurality of columns.

22. The method of claim 21, wherein
a second memory cell in a column of the plurality of columns that is not having the first memory cell is under a dummy read condition.

23. The method of claim 22, wherein
a transistor of a footer corresponding to the second memory cell is turned off a time delay after a word line of the first memory cell is activated.

* * * * *